United States Patent [19]

Halepete

[11] Patent Number: 5,786,715
[45] Date of Patent: Jul. 28, 1998

[54] PROGRAMMABLE DIGITAL FREQUENCY MULTIPLIER

[75] Inventor: Sameer D. Halepete, Sunnyvale, Calif.

[73] Assignee: Sun Microsystems, Inc., Palo Alto, Calif.

[21] Appl. No.: 667,430

[22] Filed: Jun. 21, 1996

[51] Int. Cl.$^6$ .................................................. H03B 19/00
[52] U.S. Cl. .............................. 327/116; 327/119; 377/47
[58] Field of Search ....................... 327/113, 114, 327/116, 119, 120, 121, 122, 356; 377/47, 48

[56] References Cited

U.S. PATENT DOCUMENTS

| | | | |
|---|---|---|---|
| 3,414,720 | 12/1968 | Battarel | 377/47 |
| 3,829,665 | 8/1974 | Pocock et al. | 377/47 |
| 3,992,612 | 11/1976 | Dunn | 377/47 |
| 5,463,337 | 10/1995 | Leonowich | 327/158 |
| 5,530,387 | 6/1996 | Kim | 327/119 |
| 5,548,235 | 8/1996 | Marbot | 327/116 |
| 5,563,554 | 10/1996 | Mizuno | 327/122 |

FOREIGN PATENT DOCUMENTS

| | | | |
|---|---|---|---|
| 63-245010 | 10/1988 | Japan | 327/116 |
| 63-3258112 | 10/1988 | Japan | 327/116 |

Primary Examiner—Timothy P. Callahan
Assistant Examiner—T. T. Lam
Attorney, Agent, or Firm—Limbach & Limbach L.L.P.

[57] ABSTRACT

A programmable digital frequency multiplier includes either a delay locked loop with an input clock or a ring oscillator which generates multiple phase delayed clock signals having a common frequency equal to that of the input clock and a corresponding number of equidistant phases. In the delay locked loop, a phase comparator compares the phase of the input clock as received by the first inverter circuit with the phase of the output of the last inverter circuit and generates an error signal which is used as a circuit bias control signal for each of the inverter circuits, thereby controlling the phase delay through each inverter circuit. The multiple inverter circuit output signals are individually gated in separate NOR gates with a corresponding number of frequency programming bits. The resulting NORed output signals are then processed together in an exclusive-NOR gate, thereby generating an output signal having a frequency which is an integer multiple of the input clock frequency with the integer multiple corresponding to the bit pattern of the frequency programming bits.

24 Claims, 2 Drawing Sheets

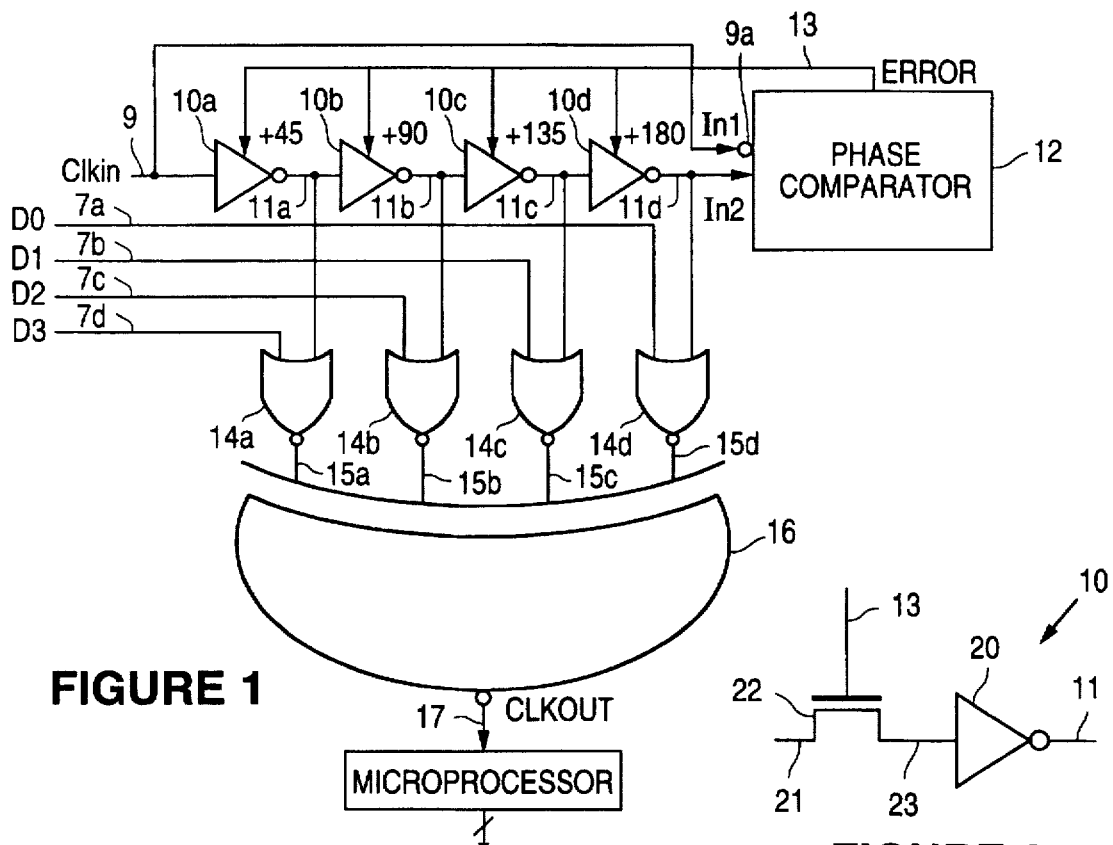
FIGURE 1
FIGURE 2
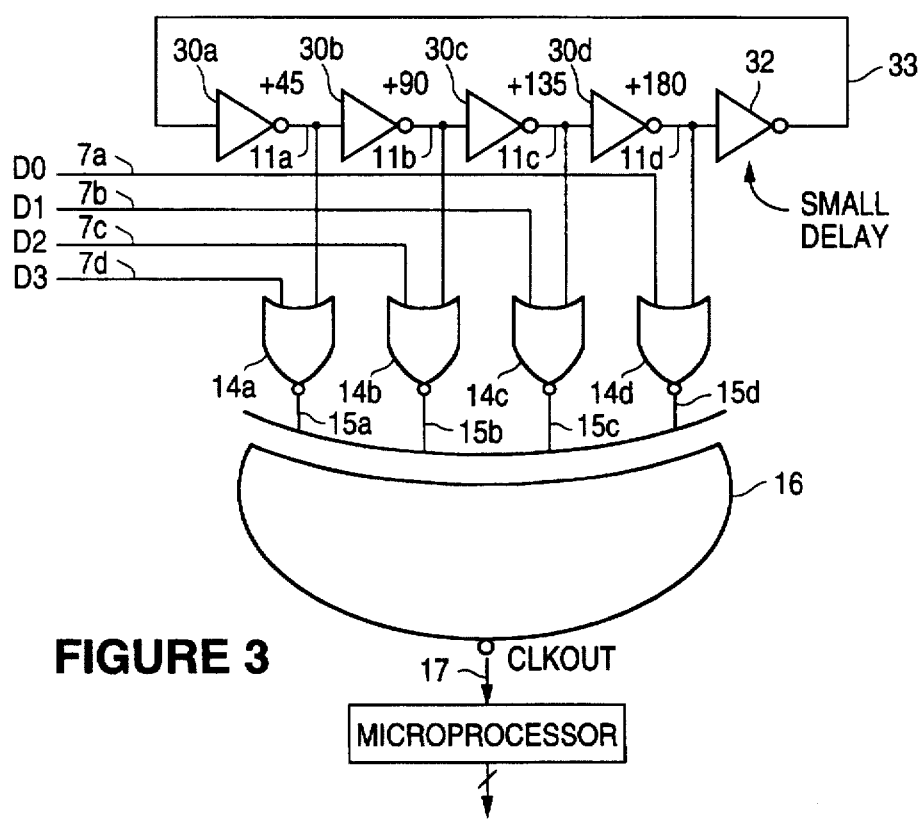
FIGURE 3

PROGRAMMABLE DIGITAL FREQUENCY MULTIPLIER

BACKGROUND OF THE INVENTION

1. Field of the Invention

The present invention relates to frequency multipliers for use in digital circuits, and in particular, digital frequency multipliers which can be programmed to generate integer multiples of a clock signal frequency.

2. Description of the Prior Art

As advances in integrated circuit technology continue to allow increasingly complex circuits to be integrated in less and less die area, such circuits, particularly microprocessors, continue to be designed and fabricated to operate at increasingly higher clock frequencies. One common conventional technique for dealing with the higher clock frequencies involves the use of a phase lock loop (PLL) to generate frequency multiples of a clock signal. However, such technique requires that the oscillator (e.g., voltage controlled oscillator) internal to the PLL have a frequency range which extends through the highest possible frequency multiple that is to be generated. This may not always be practical due to problems associated with PLL design and implementation, particularly where the PLL must be an analog circuit and is to be used in an otherwise digital environment. Further, additional problems can be encountered when it is necessary to be able to program the multiplication factor of the PLL.

Accordingly, it would be desirable to have a digital technique for generating frequency multiples of a clock signal, as well as have a simple technique for programmably determining the frequency multiple to be generated.

SUMMARY OF THE INVENTION

A programmable digital frequency multiplier in accordance with the present invention multiplies, in a synchronous and digital manner, an incoming signal frequency by a programmable integer value. This advantageously allows an external, e.g. off-chip, clock to be used which is a sub-multiple of the internal, e.g. on-chip, clock without requiring an oscillator circuit to operate with a frequency range which extends to the highest possible frequency multiple to be generated.

In accordance with one embodiment of the present invention, a programmable digital frequency multiplier includes a digital multiphase signal generator, a number of digital signal selection circuits and a digital signal combiner. The digital multiphase signal generator is configured to generate a number of source signals having a common source signal frequency and a corresponding number of different source signal phases. The digital signal selection circuits are coupled to the digital multiphase signal generator and are configured to receive the source signals and a number of multiplication control signals and in accordance therewith generate a number of selected signals, with at least one of the selected signals corresponding to at least one of the source signals. The digital signal combiner is coupled to the digital signal selection circuits and is configured to receive and logically combine the selected signals and in accordance therewith generate an output signal, with the output signal having an output signal frequency which is an integer multiple of the source signal frequency and the integer multiple corresponding to the multiplication control signals.

These and other features and advantages of the present invention will be understood upon consideration of the following detailed description of the invention and the accompanying drawings.

BRIEF DESCRIPTION OF THE DRAWINGS

FIG. 1 is a functional and logic diagram of a programmable digital frequency multiplier in accordance with one embodiment of the present invention.

FIG. 2 is a schematic diagram of one implementation of the inverter circuits used in the programmable digital frequency multiplier of FIG. 1.

FIG. 3 is a logic diagram of a programmable digital frequency multiplier in accordance with another embodiment of the present invention.

DETAILED DESCRIPTION OF THE INVENTION

Figure 4:
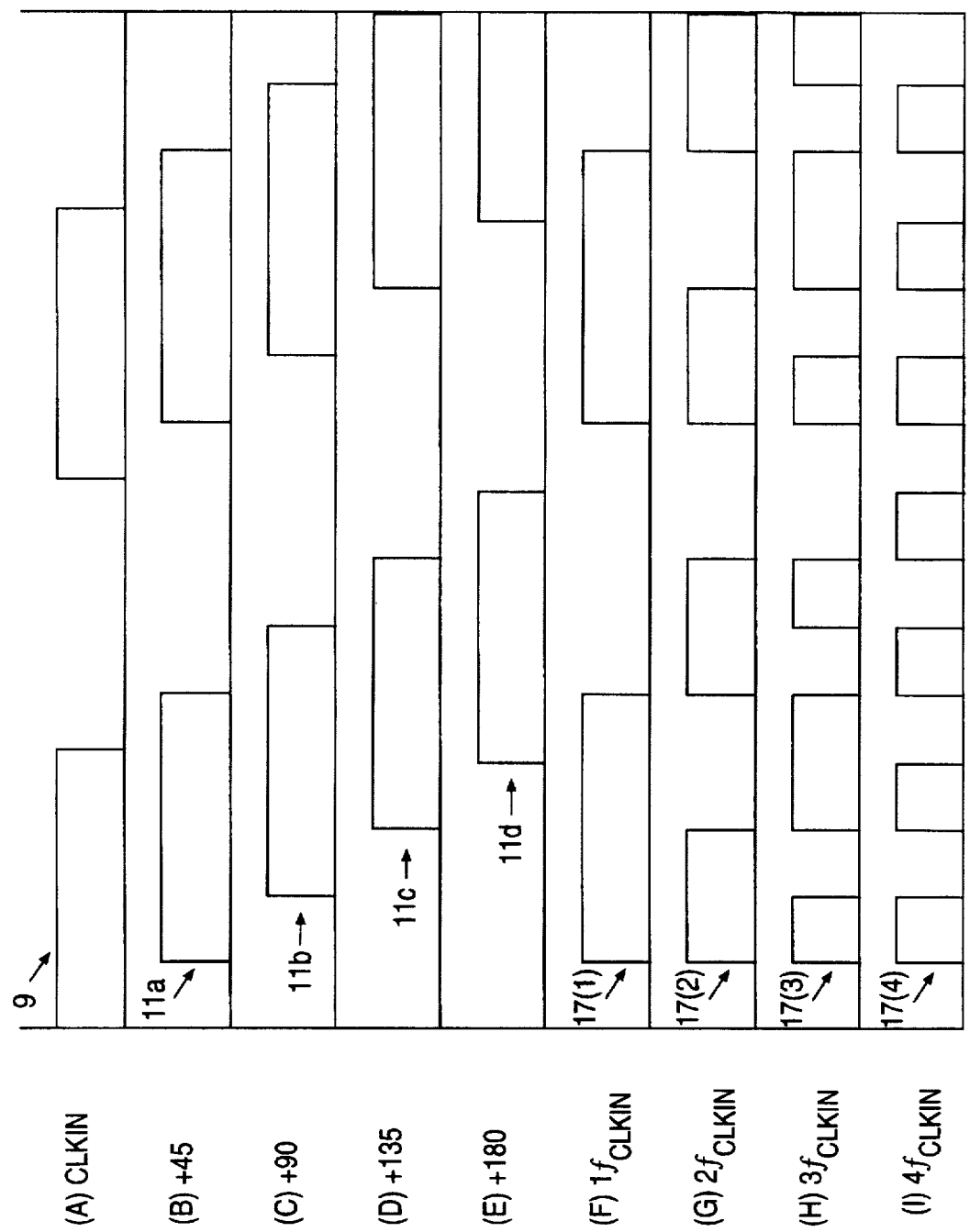
FIG. 4 is a signal timing diagram of various signals generated within the circuits of FIGS. 1 and 3.

In accordance with the present invention, a clock signal is multiplied in frequency by a programmable value. Harmonics of the clock signal frequency are generated digitally by generating phase delayed versions of the clock signal and then selectively feeding them to a series of combinational logic, such as a multiple input exclusive-OR gate, to generate the various frequencies.

Referring to FIG. 1, the frequency of a clock signal can be programmably and digitally multiplied using a delay locked loop (DLL) circuit. The clock signal 9 is propagated through a voltage controlled delay line consisting of a number of serially connected inverter circuits 10. The output of each inverter circuit 10 is phase delayed by approximately 45 degrees with respect to its input. The clock signal 9 is also inverted and inputted along with the output 11d of the last inverter circuit 10d to a phase comparator 12. The phase comparator 12 compares the phases of the inverted clock signal 9a and last inverter circuit output 11d and generates an error signal 13 which represents the phase difference between such signals 9a, 11d. This error signal 13 is fed back as a control signal to each of the inverter circuits 10. This feedback loop ensures that the clock input 9 and last inverter circuit output 11d are exactly out of phase. The delay within the delay line, i.e., within each of the inverter circuits 10, is established in accordance with the error signal 13 such that the maximum phase difference is half a cycle of the clock signal 9. Preferably, the individual inverter circuits 10a, 10b, 10c, 10d are identical, thereby resulting in inverter circuit outputs 11a, 11b, 11c, 11d which are equidistant in phase from one another.

The resulting phase delayed versions 11a, 11b, 11c, 11d of the clock signal 9 can be individually selected in accordance with a set of programming bits 7. In this embodiment, such signal phase selection is done with an exclusive-OR gate implemented as a series of input NOR gates 14 and an output exclusive-NOR gate 16. In accordance with the individual programming bits 7a, 7b, 7c, 7d, the individual phase delayed clock signals 11a, 11b, 11c, 11d are individually selected with their respective NOR gates 14a, 14b, 14c, 14d. The resulting selected signal(s) 15a/15b/15c/15d is(are) then logically combined in the exclusive-NOR gate 16 to generate the output clock signal 17 having a frequency which is an integer multiple of the frequency of the clock signal 9.

The output clock signal 17 frequency as a multiple of the internal clock signal 9 frequency is established by the programming bits D0, D1, D2, D3 in accordance with the following:

| D3 | D2 | D1 | D0 | OUTPUT |
| --- | --- | --- | --- | --- |
| 1 | 1 | 1 | 1 | 0 |
| 1 | 1 | 1 | 0 | $1f_{CLKIN}$ |
| 1 | 1 | 0 | 0 | $2f_{CLKIN}$ |
| 1 | 0 | 0 | 0 | $3f_{CLKIN}$ |
| 0 | 0 | 0 | 0 | $4f_{CLKIN}$ |

Referring to FIG. 2, the inverter circuits 10 can be implemented using a standard logic inverter 20 and a series NMOS pass transistor 22. (The order of the serially connected inverter 20 and pass transistor 22 can be such that the pass transistor 22 is at either the input or output of the inverter 20.) In accordance with the error signal 13 from the phase comparator 12 (FIG. 1), the resulting voltage at the gate at the pass transistor 22 determines the delay from its input 21 to its output 23 and, therefore, the overall phase delay from the input 21 to the output 11 of the inverter circuit 10.

Referring to FIG. 3, a programmable digital frequency multiplier in accordance with another embodiment of the present invention uses a ring oscillator instead of a DLL. The ring oscillator consists of a number of serially connected inverters, 30, 32, with the last inverter output 33 being fed back as the input to the first inverter 30a. In order to ensure that the phase delayed output signals 11a, 11b, 11c, 11d are substantially equidistant in phase with respect to one another, the delay through the last inverter 32 must be significantly smaller than the respective delays through the remaining inverters 30. Accordingly, this will allow the ring oscillator to function properly, i.e., with an odd number of inverters and signal inversions, while also providing for equal phase division of the loop signal 33. The resulting phase delayed signals 11a, 11b, 11c, 11d are then selected and used for frequency multiplication in accordance with the discussion above.

Referring to FIG. 4, the phase relationships among the various signals generated within the above-discussed programmable digital frequency multipliers are as shown. Waveform A is that of the clock signal 9. Waveforms B, C, D and E are the those of the phase delayed signals 11a, 11b, 11c, 11d which are delayed in phase by 45, 90, 135 and 180 degrees, respectively. Waveform F is that of the output clock signal 17 when the output frequency is selected to be equal to that of the internal clock signal 9. Waveforms G, H, and I are those of the output clock 17 when the output frequency is programmed to be equal to 2, 3 and 4 times that of the internal clock signal 9, respectively. (For the programmable digital frequency multiplier using a ring oscillator as shown in FIG. 3 the "internal clock signal" is the output 33 from the last inverter 32 with is fed back to the first inverter 30a.)

Based upon the foregoing discussion, it should be understood that the principles and techniques can be extended to implement programmable digital frequency multipliers in accordance with the present invention in which further integer multiples can be generated. For example, additional inverter circuits can be connected in serial combination to generate a greater number of phase delays (e.g., six inverters for phase delays of +30, +60, +90, +120, +150 and +180 degrees), thereby providing a greater selection of phase delayed signals to select from and logically combine to generate a greater number of frequency multiples of the internal clock signal.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a programmable digital frequency multiplier comprising:

a digital multiphase signal generator configured to generate a plurality of source signals having a common source signal frequency and a corresponding plurality of different source signal phases;

a plurality of digital signal selection circuits including a plurality of logic gates comprising a plurality of NOR gates, coupled to said digital multiphase signal generator, configured to receive said plurality of source signals and a plurality of multiplication control signals and in accordance therewith generate a plurality of selected signals, wherein at least one of said plurality of selected signals corresponds to at least one of said plurality of source signals; and a digital signal combiner, coupled to said plurality of digital signal selection circuits, configured to receive and logically combine said plurality of selected signals and in accordance therewith generate an output signal, wherein said output signal has an output signal frequency which is an integer multiple of said common source signal frequency and said integer multiple corresponds to said plurality of multiplication control signals.

2. The apparatus of claim 1, wherein selected ones of said source signal phases are equidistant in phase from one another.

3. The apparatus of claim 1, wherein said digital multiphase signal generator comprises a plurality of serially coupled inverter circuits.

4. The apparatus of claim 3, wherein a first one of said plurality of serially coupled inverter circuits receives an input clock signal having a clock signal phase and in accordance therewith said plurality of serially coupled inverter circuits generates said plurality of source signals, and wherein each one of said plurality of source signals is synchronized to said input clock signal.

5. The apparatus of claim 4, wherein:

each one of said plurality of serially coupled inverter circuits receives an inverter control signal and in accordance therewith receives an input signal and generates one of said plurality of source signals;

said digital multiphase signal generator further comprises a phase comparator, coupled to said first one and a second one of said plurality of serially coupled inverter circuits, configured to receive said input clock signal and a preselected one of said plurality of source signals; and said phase comparator compares said signal phases of said input clock signal and said preselected one of said plurality of source signals and in accordance therewith generates said inverter control signal.

6. The apparatus of claim 5, wherein each one of selected ones of said plurality of serially coupled inverter circuits receives one of said plurality of source signals as said input signal with one of said corresponding plurality of different source signal phases and generates another one of said plurality of source signals with another one of said corresponding plurality of different source signal phases, and wherein said another one of said corresponding plurality of different source signal phases is delayed in phase from said one of said corresponding plurality of different source signal phases in accordance with said inverter control signal.

7. The apparatus of claim 1, wherein said digital signal combiner comprises a logic gate.

8. The apparatus of claim 7, wherein said logic gate comprises an exclusive-OR gate.

9. An integrated circuit including a microprocessor and a programmable digital frequency multiplier, said integrated circuit comprising:

a digital multiphase signal generator configured to generate a plurality of source signals having a common source signal frequency and a corresponding plurality of different source signal phases;

a plurality of digital signal selection circuits including a plurality of logic gates comprising a plurality of NOR gates, coupled to said digital multiphase signal generator, configured to receive said plurality of source signals and a plurality of multiplication control signals and in accordance therewith generate a plurality of selected signals, wherein at least one of said plurality of selected signals corresponds to at least one of said plurality of source signals;

a digital signal combiner, coupled to said plurality of digital signal selection circuits, configured to receive and logically combine said plurality of selected signals and in accordance therewith generate an output clock signal, wherein said output clock signal has an output clock signal frequency which is an integer multiple of said common source signal frequency and said integer multiple corresponds to said plurality of multiplication control signals; and a microprocessor, coupled to said digital signal combiner, configured to receive said output clock signal and in accordance therewith receive and process a plurality of input data to provide a plurality of output data.

10. The integrated circuit of claim 9, wherein selected ones of said source signal phases are equidistant in phase from one another.

11. The apparatus of claim 9, wherein said digital multiphase signal generator comprises a plurality of serially coupled inverter circuits.

12. The apparatus of claim 11, wherein a first one of said plurality of serially coupled inverter circuits receives an input clock signal having a clock signal phase and in accordance therewith said plurality of serially coupled inverter circuits generates said plurality of source signals, and wherein each one of said plurality of source signals is synchronized to said input clock signal.

13. The apparatus of claim 12, wherein:

each one of said plurality of serially coupled inverter circuits receives an inverter control signal and in accordance therewith receives an input signal and generates one of said plurality of source signals;

said digital multiphase signal generator further comprises a phase comparator, coupled to said first one and a second one of said plurality of serially coupled inverter circuits, configured to receive said input clock signal and a preselected one of said plurality of source signals; and said phase comparator compares said signal phases of said input clock signal and said preselected one of said plurality of source signals and in accordance therewith generates said inverter control signal.

14. The apparatus of claim 13, wherein each one of selected ones of said plurality of serially coupled inverter circuits receives one of said plurality of source signals as said input signal with one of said corresponding plurality of different source signal phases and generates another one of said plurality of source signals with another one of said corresponding plurality of different source signal phases, and wherein said another one of said corresponding plurality of different source signal phases is delayed in phase from said one of said corresponding plurality of different source signal phases in accordance with said inverter control signal.

15. The apparatus of claim 9, wherein said digital signal combiner comprises a logic gate.

16. The apparatus of claim 15, wherein said logic gate comprises an exclusive-OR gate.

17. A method of providing an apparatus including a programmable digital frequency multiplier, said method comprising the steps of:

providing a digital multiphase signal generator for performing the step of generating a plurality of source signals having a common source signal frequency and a corresponding plurality of different source signal phases;

providing a plurality of digital signal selection circuits including a plurality of logic gates comprising a plurality of NOR gates for performing the step of receiving said plurality of source signals and a plurality of multiplication control signals and in accordance therewith generating a plurality of selected signals with at least one of said plurality of selected signals corresponding to at least one of said plurality of source signals; and providing a digital signal combiner for performing the step of receiving and logically combining said plurality of selected signals and in accordance therewith generating an output signal with said output signal having an output signal frequency which is an integer multiple of said common source signal frequency and said integer multiple corresponding to said plurality of multiplication control signals.

18. The method of claim 17, wherein said step of providing a digital multiphase signal generator for performing the step of generating a plurality of source signals having a common source signal frequency and a corresponding plurality of different source signal phases comprises providing a digital multiphase signal generator for performing the step of generating a plurality of source signals having a common source signal frequency and a corresponding plurality of different source signal phases with selected ones thereof being equidistant in phase from one another.

19. The method of claim 17, wherein said step of providing a digital multiphase signal generator for performing the step of generating a plurality of source signals having a common source signal frequency and a corresponding plurality of different source signal phases comprises providing a plurality of serially coupled inverter circuits.

20. The method of claim 19, wherein said step of providing a plurality of serially coupled inverter circuits comprises providing a first one of said plurality of serially coupled inverter circuits for performing the step of receiving an input clock signal having a clock signal phase and in accordance therewith generating said plurality of source signals with said plurality of source signals being synchronized to said input clock signal.

21. The method of claim 20, wherein:

said step of providing a plurality of serially coupled inverter circuits comprises providing each one of said plurality of serially coupled inverter circuits for performing the step of receiving an inverter control signal and in accordance therewith receiving an input signal and generating one of said plurality of source signals;

said step of providing a digital multiphase signal generator for performing the step of generating a plurality of source signals having a common source signal frequency and a corresponding plurality of different source signal phases further comprises providing a phase comparator for performing the step of receiving said input clock signal and a preselected one of said plurality of source signals; and said step of providing a phase comparator for performing the step of receiving said input clock signal and a preselected one of said plurality of source signals comprises providing said phase comparator for performing the step of comparing said signal phases of said input clock signal and said preselected one of said plurality of source signals and in accordance therewith generating said inverter control signal.

22. The method of claim 21, wherein said step of providing each one of said plurality of serially coupled inverter circuits for performing the step of receiving an inverter control signal and in accordance therewith receiving an input signal and generating one of said plurality of source signals comprises providing each one of selected ones of said plurality of serially coupled inverter circuits for performing the step of receiving one of said plurality of source signals as said input signal with one of said corresponding plurality of different source signal phases and generating another one of said plurality of source signals with another one of said corresponding plurality of different source signal phases and with said another one of said corresponding plurality of different source signal phases being delayed in phase from said one of said corresponding plurality of different source signal phases in accordance with said inverter control signal.

23. The method of claim 17, wherein said step of providing a digital signal combiner for performing the step of receiving and logically combining said plurality of selected signals and in accordance therewith generating an output signal with said output signal having an output signal frequency which is an integer multiple of said source signal frequency and said integer multiple corresponding to said plurality of multiplication control signals comprises providing a logic gate.

24. The method of claim 23, wherein said step of providing a logic gate comprises providing an exclusive-OR gate.

* * * * *